(12) United States Patent
Hirano

(10) Patent No.: US 6,198,659 B1
(45) Date of Patent: Mar. 6, 2001

(54) DEFECTIVE ADDRESS DATA STORAGE CIRCUIT FOR NONVOLATILE SEMICONDUCTOR MEMORY DEVICE HAVING REDUNDANT FUNCTION AND METHOD OF WRITING DEFECTIVE ADDRESS DATA

(75) Inventor: Yasuaki Hirano, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/592,964

(22) Filed: Jun. 13, 2000

(30) Foreign Application Priority Data

Jul. 1, 1999 (JP) .................................................. 11-187698

(51) Int. Cl.[7] .................................................... G11C 16/00
(52) U.S. Cl. ....................... 365/185.09; 365/200; 365/201
(58) Field of Search ..................................... 365/200, 201, 365/185.09

(56) References Cited

U.S. PATENT DOCUMENTS

| | | | | |
|---|---|---|---|---|
| 5,357,473 | * | 10/1994 | Mizuno et al. ........................ | 365/201 |
| 5,430,678 | * | 7/1995 | Tomita et al. ........................ | 365/200 |
| 5,523,974 | * | 6/1996 | Hirano et al. ........................ | 365/200 |
| 6,011,734 | * | 1/2000 | Pappert ................................. | 365/201 |
| 6,031,771 | * | 2/2000 | Yiu et al. .............................. | 365/200 |

FOREIGN PATENT DOCUMENTS 5-276018   10/1993  (JP) .

OTHER PUBLICATIONS

Yamauchi et al., "A New Cell Structure for Sub–quarter Micron High Density Flash Memory" (IEDM 1995) pp. 267–270.

Hirano et al., "A sensing scheme for a ACT flash memory"(Technical Report of IEICE. ICD97–21 (1997–05) pp. 37–42.

Kato et al., "'AND' cell structure for a 3V–only 64Mbit Flash Memory" (Technical Report of IEICE. SDM93–134 (1993–11) ) pp. 37–42.

Kobayashi et al., "A 3.3V only 16Mb DINOR Flash Memory" (Technical Report of IEICE. ICD95–38 (1995–05) ) pp. 55–60.

\* cited by examiner

*Primary Examiner*—Tan T. Nguyen
(74) *Attorney, Agent, or Firm*—Morrison & Foerster LLP

(57) ABSTRACT

In a defective address data storage circuit for a nonvolatile semiconductor memory, electrically erasable programmable memory cells are arranged in rows and columns. A plurality of word lines are connected to the memory cells in each row, while a plurality of bit lines are connected to the memory cells in each column. There are further provided a column decoder for selecting a bit line and a word line decoder circuit selecting a different word line in a different write operation of defective address data. Because a different word line is selected every writing of defective address data, a write voltage is only once applied to memory cells connected to an identical word line.

12 Claims, 10 Drawing Sheets

DEFECTIVE ADDRESS DATA STORAGE CIRCUIT FOR NONVOLATILE SEMICONDUCTOR MEMORY DEVICE HAVING REDUNDANT FUNCTION AND METHOD OF WRITING DEFECTIVE ADDRESS DATA

BACKGROUND OF THE INVENTION

The present invention relates to a nonvolatile semiconductor memory device having a redundant function of relieving a defective portion inside a memory cell array by substituting a reserved or relief portion (redundancy) for the defective portion, and in particular, to an address data storage circuit incorporated in such a nonvolatile semiconductor memory device for storing the address data of the defective portion and a method of writing the address data of the defective portion to the storage circuit.

In connection with nonvolatile semiconductor memory devices, there is a known method for replacing defective bit lines, defective word lines and defective memory cells with reserved ones (redundancy) to increase the yield. In the nonvolatile semiconductor memory device utilizing such a method, the addresses of the defective bit lines, the defective word lines and the defective memory cells, i.e., the defective address data are required to be stored.

Conventionally, methods for storing the defective address data typically employ a fuse, as disclosed in, for example, the Japanese Patent Laid-Open Publication No. HEI 6-150689. FIG. 9 shows one example of a defective address data storage circuit employing a fuse. This figure shows the case where 3-bit address data is stored.

In this circuit, assuming that the address of the defective bit is 101, then the second fuse F1 is cut. Identification of the defective bit (defective address) and cutting of the fuse are performed during the device test.

Reference is next made to the case where the device actually operates after the completion of the test. If a power voltage Vcc rises, then a signal rdcamen comes to have a "high" level, and a transistor Tr that receives this signal as an input to its gate is turned on. In this stage, the first fuse F0 and the third fuse F2 are each conductive. Therefore, a voltage Vss is supplied to the inputs of the corresponding inverters In0 and In2, and output terminals radd0 and radd2 of the inverters come to have a "high" level. On the other hand, with regard to an output signal from a terminal radd1, because the fuse F1 has been cut, the input of the corresponding inverter In1 is provided with a voltage of Vcc via a capacitor C, and the output comes to have a "low" level. The corresponding p-channel MOS transistor P is turned on, so that the "low" level is latched. Consequently, data of 101 is output from the output terminals radd0 through radd2.

The most serious problem of this method is the layout area of the fuse portions. In accordance with the increase in integration density and the consequent increase in number of addresses to be stored, the layout area of these portions is inevitably increased. Therefore, the area is required to be reduced.

As a measure for solving this problem, there is a method of employing an electrically programmable nonvolatile semiconductor memory device in place of the fuse, as disclosed in, for example, the Japanese Patent Laid-Open Publication No. HEI 5-276018. FIG. 10 shows a circuit diagram of an example for storing a 3-bit address employing this method. As is apparent from FIG. 10, nonvolatile semiconductor memory cells M0 through M2 having electrically erasable programmable floating gates are arranged in place of the fuses shown in FIG. 9. In this case, instead of the cutting of the fuses, programming of the nonvolatile semiconductor memory cells is required. For this reason, a column decoder (not shown) for selectively turning on transfer gates Tr0, Tr1 and Tr2 by bit line selection signals bitsel0, bitsel1 and bitsel2, a data latch circuit LAT for writing defective address data and a level shifter HV are added to the circuit.

Reference is then made to the case where the address 101 is stored into this circuit. The circuit shown in FIG. 10 is adapted for a flash memory which is programmed by means of channel hot electrons, as represented by ETOX (EPROM Thin Oxide). In the flash memory of this type, the threshold value of the memory cell in the initial state is about 1 V to 2 V.

The programming, or writing is performed by using channel hot electrons. A defective address is serially output to a data line DL in FIG. 10. First, a "high" level signal corresponding to the first "1" of the defective address 101 is output to the data line DL. This signal is inverted by the write data latch circuit LAT and latched. Then, a "low" level signal is supplied to the level shifter HV, and the level shifter HV outputs 0 V. As a result, the transfer gate Tr3 is turned off.

On the other hand, a voltage Vpp (10 V, for example) is applied to a word line WL of the memory cells. Then, to write to the memory cell M0, the signal bitsel0 of the voltage Vpp is applied to the transfer gate Tr0. Therefore, the transfer gate Tr0 is turned on. However, the foregoing transfer gate Tr3 is off, and therefore, the bit line BL0 is placed in a floating state. Therefore, no programming is performed in the memory cell M0, and the threshold value of the memory cell M0 remains in a low state (not higher than 2 V). In this stage, the bit lines BL1 and BL2 are also in the floating state.

In accordance with the next timing, a "low" level signal corresponding to "0" of the defective address 101 is output to the data line DL. Also, the signal bitsel1 of the voltage Vpp is applied to the transfer gate Tr1, and accordingly, the transfer gate Tr1 is turned on. A "high" level (Vpp level) signal is output from the level shifter HV. Therefore, the transfer gate Tr3 is turned on to output a voltage hhprg (6 V, for example) to the bit line BL1. In this stage, the bit lines BL0 and BL2 are in the floating state. On the other hand, the voltage Vpp is applied to the word line WL. Therefore, programming of the memory cell M1 is performed by channel hot electrons, increasing the threshold value.

Subsequently, data corresponding to the last "1" of the defective address 101 is stored into the memory cell M2. This operation is similar to the aforementioned operation on the memory cell M0. As a result, no programming, or writing, of the memory cell M2 is performed, and the threshold value of the memory cell M2 is maintained in a low state.

The identification of the defective address and the writing of the defective address data to a memory cell are performed during the device test, basically in the wafer test stage. The wafer test is performed for one chip not one time but several times, at least two times as a normal temperature test and a high temperature test. Then, writing of the defective address data in a manner as described above is performed every test, which means that the writing is performed at least two times, namely at the normal temperature test and the high temperature test. In addition, the normal temperature test, for example, includes several test items, and it is a normal practice to write the defective address data each time for each test item, rather than writing the data collectively after the completion of all the tests.

Generally, the aforementioned writing is performed to memory cells connected to one word line in order for data such as the defective address and the like to be output when the device power starts, as described hereinbelow.

Reference is next made to the operation when the device is actually used after the storage of the defective address data.

First, if the power voltage is applied to the device, then the signal rdcamen rises to Vcc (3 V, for example), and the transfer gate Tr that receives this signal at its gate is turned on. Further, the word line WL also rises to Vcc, so that the memory cells M0 and M2 having a low threshold value are turned on to pull the bit lines BL0 and BL2 to the Vss level. As a result, "high" level signals as inverted are output from the output terminals radd0 and radd2.

On the other hand, the memory cell M1 is not turned on since the threshold value of the memory cell M1 has been increased. Therefore, upon turning on the power, the potential of the bit line BL1 increases from Vcc via a capacitor C1. Consequently, the output of the inverter In1 goes "low" to turn on the associated p-channel MOS transistor P, by which the input of the inverter In1 is set "high" and latched. By this operation, the defective address 101 is supplied to the inverter output terminals radd0, radd1 and radd2, similarly to the case using the fuse shown in FIG. 9.

The above has described the flash memory of the type that uses channel hot electrons.

Lately, the increasing integration density of flash memories has required to reduce the consumption of power. This requirement has been satisfied by utilizing the FN (Fowler-Nordheim) tunneling phenomenon for the write operation (programming) and erase operation (erasing). The flash memory that utilizes the FN tunneling phenomenon for both the programming and erasing is called the "FN-FN type flash memory" here. In the case where defective address data is stored by means of the FN-FN type flash memory cells, the storage circuit would be one as shown in FIG. 11, which is conceivable from the circuit diagram of FIG. 10. The operation of the circuit will be described next.

First, the memory cells are collectively erased (put into the high threshold value state) in the following manner. A voltage Vns (−8 V, for example) is applied to a common source and a substrate (well) on which the memory cells are formed. By turning off transfer gates Tr that receive the signal rdcamen and the signal rdpgen at their gates, all the bit lines BL are put into the open state. Also, a voltage Vpp (10 V, for example) is applied to a word line WL connected to the control gates of the memory cells. Thus, the FN tunneling phenomenon occurs and electrons are injected from the channel layer into the floating gate. As a consequence, the threshold voltage of the memory cells is increased to more than 4 V and the memory cells are thus put into the erased state.

Next, the defective address data is written to memory cells. The defective address is serially output to the data line DL, in accordance with the timing of which the transfer gates Tr0, Tr1 and Tr2 are turned on or off by the bit line selection signals bitsel0, bitsel1 and bitsel2 from the column decoder (not shown).

First, the defective address data are transferred to the respective latch circuits LAT0, LAT1 and LAT2. Assuming that the defective address is 101 similarly to the aforementioned case, then the "high" level corresponding to the first data "1" is output to the data line DL. The transfer gate Tr0 is turned on by the signal bitsel0, and the "high" level is latched in the latch circuit LAT0. In accordance with the next timing, the "low" level corresponding to the data "0" is supplied to the latch circuit LAT1 via the transfer gate Tr1, which is now turned on, and then latched. Subsequently, the "high" level is latched in the latch circuit LAT2.

Next, a voltage Vnn (−8 V, for example) is applied to the word line WL, and in order to increase the speed of writing to the memory cells, the voltage of the signal hhprg is raised from the preceding voltage Vcc (3 V, for example) to the voltage Vpg (5 V, for example). Also, the signal rdpgen is raised to the voltage Vpps (7 V, for example) to turn on the transfer gate Tr that receives the signal rdpgen at its gate. The "high" level is latched in the latch circuits LAT0 and LAT2, so that the voltage Vpg is output to the bit lines BL0 and BL2. By this operation, the FN tunneling phenomenon occurs on the drain side of the memory cells M0 and M2 inside the memory cell array, extracting the electrons from the floating gate to the drain side. Consequently, the threshold value is lowered to a voltage of not higher than 2 V, meaning that the programming has been achieved. On the other hand, with regard to the memory cell M1, the bit line BL1 comes to have the voltage Vss (0 V) since the "low" level is latched in the latch circuit LAT1. Therefore, no programming is performed, and the threshold value is maintained at a voltage of more than 4 V. Until this time, the transfer gate transistors Tr that receive the signal rdcamen at their respective gates are allowed to be off.

The operation of the circuit when the device is actually used after the storage of the defective address data is similar to that of the aforementioned case. If the power is supplied to the device so as to apply the voltage Vcc (3 V, for example) and Vss (0 V) to the word line WL and the common source, respectively, then the defective address data 101 is output from the output terminals radd0, radd1 and radd2.

Disturb is one of problems to be discussed in the case of the flash memory. In this case, the most serious problem is the gate disturb in the write stage.

The state of the write gate disturb in the flash memory shown in FIG. 10 is schematically shown in FIG. 12. The memory cell shown in FIG. 12 is an unselected memory cell. The control gates of unselected memory cells are connected to the same word line WL as that of the selected memory cell. Therefore, the voltage Vpp (10 V) is applied also to the unselected memory cells in the data writing (programming) stage. The sources are all connected to the common source of the voltage Vss (0 V), as is apparent from FIG. 10. On the other hand, the drains are connected to the respective bit lines in the floating state (open). The substrate (well) is shared between the selected and unselected memory cells, and is at the voltage Vss (0 V). Therefore, even the unselected memory cells are brought into a slightly written state due to an electric field across the floating gate and the substrate (well), as a consequence of which the threshold values of the unselected memory cells vary (increase in this case, causing a disturb.). If the threshold values considerably change, the erased memory cells may be erroneously read as the "written state" although they should be read as the erased state.

In the case of the channel hot electrons, the write speed per cell is about 1 μs (microsecond). Therefore, even if, for example, 256 memory cells are sequentially subjected to writing according to the system in which the writing is performed cell by cell as described hereinabove, the disturb time for each cell is max. 255 μs on the most severe conditions. This duration is very short as the disturb time, and the device can sufficiently stand the disturb. Accordingly, there occurs no erroneous reading ascribed to a shift of the threshold value of the memory cell.

However, in the circuit system in which the address data are collectively transferred to the latch circuit so as to execute writing of the data into the memory cells inside the memory array as shown in FIG. 11, the following problem occurs.

In the FN-FN type flash memory, the writing speed utilizing the FN tunneling phenomenon is about 1 ms (millisecond) per memory cell, the speed being much slower than that of the aforementioned channel hot electron type. An example of the gate disturb state of the flash memory executing writing utilizing the FN tunneling phenomenon is schematically shown in FIG. 13.

The memory cell shown in FIG. 13 is an unselected memory cell. The control gates of unselected memory cells are connected to the word line WL together with the selected memory cell, and therefore, the voltage Vnn (−8 V) is also applied to the unselected memory cells as well when writing the defective address data. As is apparent from the foregoing description (on the operation of the memory cell that is not subjected to writing) and FIG. 11, the bit line BL connected to the drain of the unselected memory cell has the voltage Vss (0 V), while the source of the memory cell is open (because the common source line is open). The substrate (well) is common to the selected memory cell and the unselected memory cell and is supplied with the voltage Vss (0 V). Therefore, even the unselected memory cell is brought into a slightly written state due to the electric field across the floating gate and the substrate (well), and the threshold value of the unselected memory cell changes (decreases in this case. A disturb has occurred.). If the threshold value changes greatly, the erased memory cells may be erroneously read as the "written state" although they should be read as the erased state.

The writing utilizing the FN tunneling phenomenon is about 1 ms (millisecond) per memory cell, the speed being very slow, as described hereinabove. Therefore, if, for example, 256 memory cells are sequentially subjected to writing, then the gate disturb time adds up to 255 ms (1 ms during which one memory cell is selected, and 255 ms during which the other memory cells are selected). Furthermore, if a plurality of tests (for example, the normal temperature test and the high temperature test on the wafer basis and the tests of individual items) are performed as described above, then the aforementioned gate disturb time adds up to an enormous value. Due to this very long gate disturb time, the threshold value of the memory cell disadvantageously varies. Actually, a gate disturb time of not shorter than 2 ms has caused reduction of the threshold value of some memory cells to less than 4 V, depending on the fabricating conditions.

This reduction in threshold value progresses to eventually flow a current through the memory cell when the voltage Vcc is applied to the word line WL. If the threshold value becomes lower than a threshold voltage Vth at the input of the defective address latch circuit due to this, then an output that should properly be a "low" level signal is erroneously supplied as a "high" level signal at the terminal radd, resulting in the output of the wrong defective address.

SUMMARY OF THE INVENTION

Accordingly, an object of the present invention is to provide a defective address data storage circuit that stores the address data of a defective portion which might occur in the memory cell array of a nonvolatile semiconductor memory device having a redundant function and that is capable of avoiding the gate disturb at the time of writing the defective address data and accordingly enhancing reliability. A further object of the present invention is to provide a method of writing the defective address data to such a defective address data storage circuit.

According to an aspect of the present invention, there is provided a defective address data storage circuit for storing address data of a defective portion occurring in a memory cell array of a nonvolatile semiconductor memory device having a redundant function, comprising:

electrically erasable programmable memory cells arranged in rows and columns;
word lines connected with the memory cells in each row;
bit lines connected with the memory cells in each column;
a bit line selection device; and
a word line selection device selecting a different word line in a different write operation of defective address data.

According to another aspect of the present invention, there is provided a method of writing address data of a defective portion occurring in a memory cell array of a nonvolatile semiconductor memory having a redundant function to a defective address data storage circuit which is included in the nonvolatile semiconductor memory and has electrically erasable programmable memory cells arranged in rows and columns, word lines connected with the memory cells in each row, and bit lines connected with the memory cells in each column, comprising:

a first step of selecting all the word lines to collectively erase all the memory cells in the defective address data storage circuit; and
a second step of selecting one of the word lines and also selecting bit lines corresponding in number to bits of the address data to be written, to thereby write the address data to memory cells connected to the selected word line and bit lines,
wherein when performing the second step repeatedly, selection of one word line is made from word lines not previously selected to thereby write a memory cell connected to a different word line in each of write operations of defective address data.

According to the present invention, each write operation is performed in the memory cells connected to a different word line, i.e., a write voltage is applied only once to the memory cells connected to one word line. Therefore, if writing is performed a plurality of times, then the gate disturb (change in threshold value of the memory cell in the written state) of the memory cells is much less than that of the conventional technique of using only one word line. This arrangement avoids misread of the defective address data. As a result, a defective address data storage circuit of high reliability is achieved. Therefore, in the nonvolatile semiconductor memory device provided with this defective address data storage circuit, addresses of a defective bit line, a defective word line and the like can be reliably replaced by addresses of relief or reserved memory cells. Therefore, the present invention contributes to the improvement of yields of nonvolatile semiconductor memory devices of an increased capacity and to the reduction of manufacturing cost.

According to the present invention, which employs a plurality of word lines, the gate disturb time in the memory cell writing stage is very short, as compared with the conventional technique that employs only one word line.

Therefore, the present invention can also be appropriately applied to an FN-FN type nonvolatile semiconductor memory device of a slow write speed.

According to the present invention, the memory cells in the defective address data storage circuit are set in an array of matrix form, namely, in rows and columns, an increased degree of freedom can be given to the frequency of tests. Furthermore, if the memory cell arrangement pattern is uniformed, the manufacturing conditions relating to the exposure and so on can be uniformed. Therefore, the memory cells of the defective address data storage circuit can be formed such that their characteristics are close to the characteristics of proper memory cells of the nonvolatile semiconductor memory device and do not disperse much.

In one embodiment, a different bit line is selected in each of write operations such that only one memory cell per bit line is written. With this arrangement, the drain disturb is reduced as much as possible. Furthermore, this arrangement allows the write data to be read all together by concurrently selecting the data lines connected to the memory cells in which writing has been performed.

In one embodiment, the erase operation and the write operation of memory cells are both performed by utilizing Fowler-Nordheim tunneling phenomenon.

In the FN-FN type memory cell, it is possible to inject and extract electrons into and from the floating gate with low consumption of power. Therefore, the erasing and writing of the memory cell can be performed with low consumption of power. This reduces the load on a charge pump circuit for generating various boost voltages from the power voltage Vcc. Accordingly, not only the reduction in consumption of power but also the reduction in power voltage can be achieved.

In one embodiment, when collectively erasing the memory cells, all the word lines are selected to bring all the memory cells into a high threshold state in which the threshold value is higher than a read voltage to be applied to a word line when reading the written data. Memory cells that have undergone no writing keep the high threshold state even after the defective address data write operation has been completed.

With this arrangement, even if the writing is performed a plurality of times to program the memory cells coupled to different word lines, a memory cell on one bit line that has undergone the writing (being in a low threshold value state) can effectively output data, without being affected by the other memory cells on the same bit line that have not undergone the writing (being in a high threshold value state). Therefore, if a test result is stored into a memory cell coupled with a different word line and a different bit line each time a test is performed, results of a plurality of tests are stored in memory cells coupled to different word lines and different bit lines. On the other hand, if a read voltage (which has an approximately intermediate value between a threshold voltage of the memory cell in the erased state and a threshold voltage of the memory cell in the written state) is applied to all word lines connected the programmed memory cells, the stored defective address data is correctly and collectively output when power is applied to the device incorporating this defective address data storage circuit.

As the aforementioned read voltage, the power voltage is preferably used. If the power voltage Vcc is used, the read voltage can be obtained without providing any new voltage generating circuit. Furthermore, if the threshold voltage of the memory cell in the high threshold state is set to a value higher than the power voltage Vcc, the memory cells can be brought into an off state even if the read voltage (Vcc, for example) is applied to the word line of the defective address data storage circuit during the normal device operation (including the power-on time). Also, a read margin can be provided by making the threshold value sufficiently high.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 9:
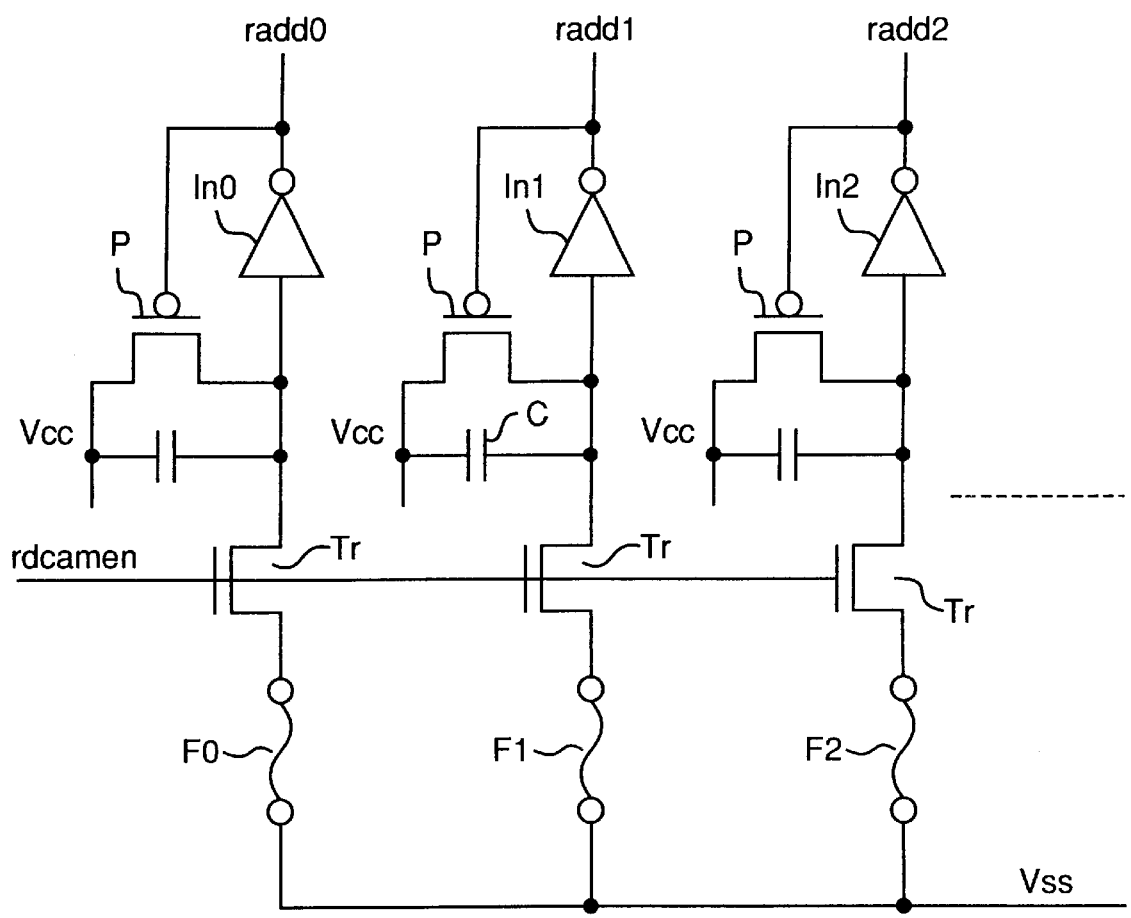
FIG. 9 is a diagram showing a circuit for storing a defective address by means of fuses.
Figure 10:
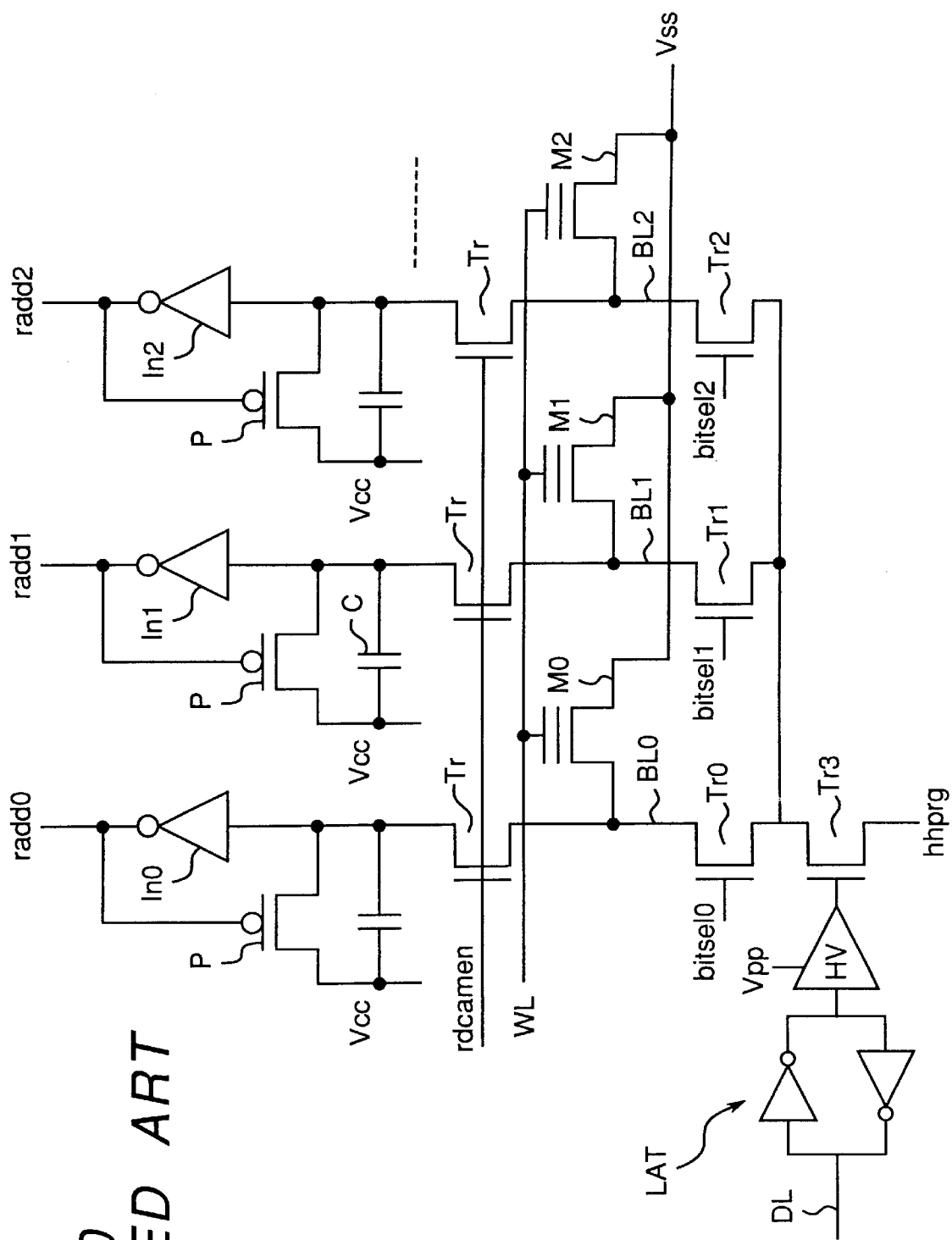
FIG. 10 is a diagram showing a conventional circuit for storing the bits of a defective address by means of nonvolatile semiconductor memory cells.
Figure 11:
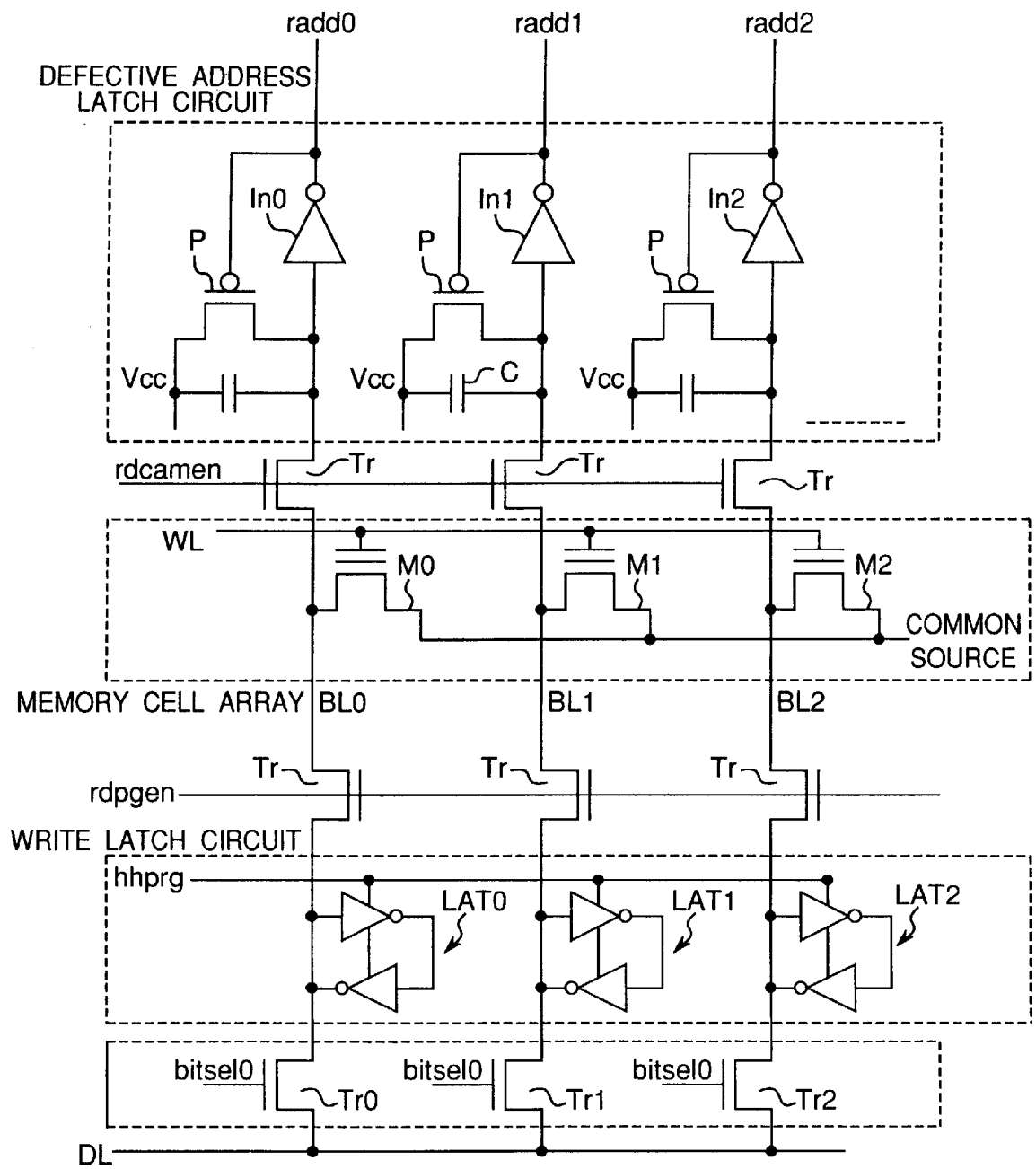
FIG. 11 is a diagram showing a circuit for storing the bits of a defective address by means of FN-FN type nonvolatile semiconductor memory cells.
Figure 12:
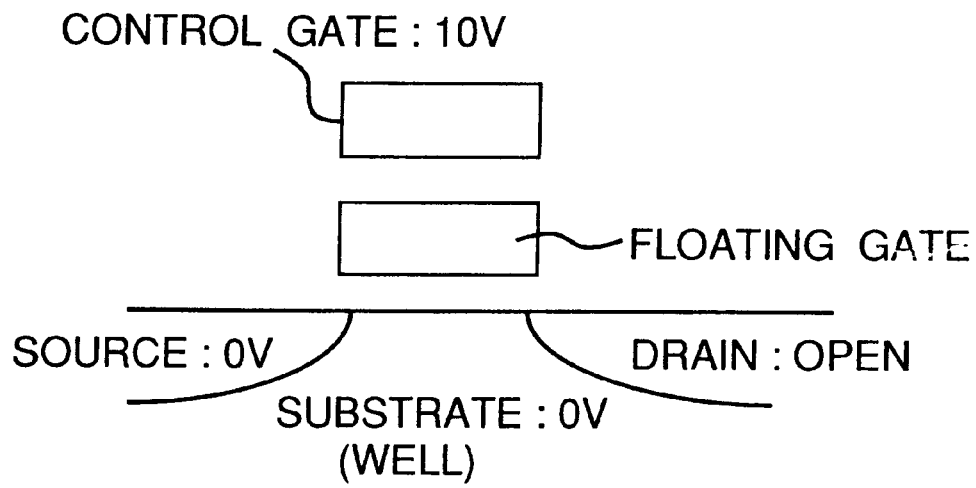
FIG. 12 is a diagram for explaining gate disturb in the write stage of a flash memory which is programmable by means of channel hot electrons.
Figure 13:
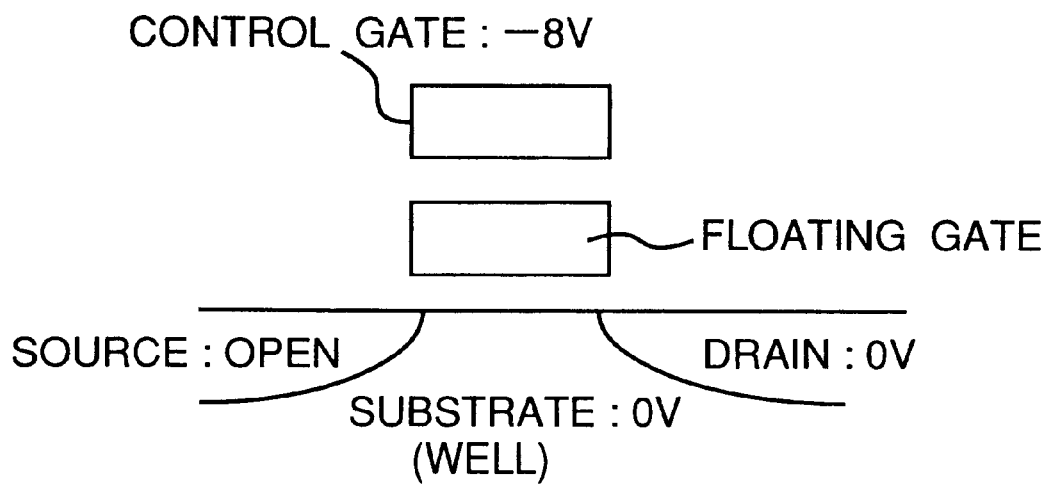
FIG. 13 is a diagram for explaining gate disturb in the write stage of the FN-FN type flash memory.

The present invention will be described in detail below on the basis of the embodiments thereof shown in the drawings. It is to be noted that in the drawings that show the embodiments of the present invention, signals, signal lines, terminals and so on similar to those employed in the circuits shown in FIGS. 9 through 11 are denoted by the same reference numerals as those used in FIGS. 9 through 11.

First Embodiment

Figure 1:
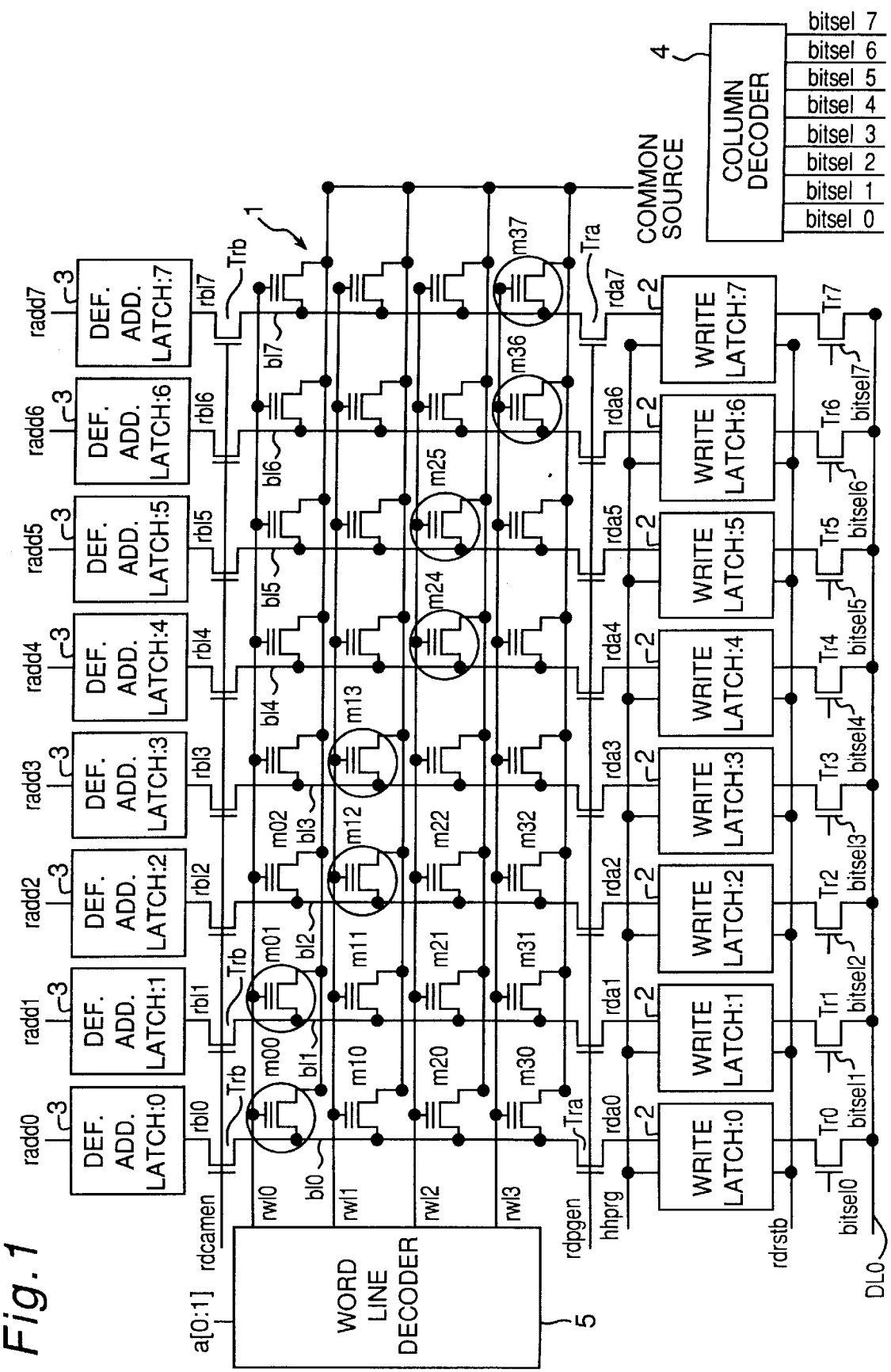
FIG. 1 is a circuit diagram showing a first embodiment of the present invention.

FIG. 1 shows an example of a defective address data storage circuit according to the present invention. As is apparent from the figure, this circuit is provided with a memory cell array 1 having a plurality of memory cells m00 through m37 arranged in a matrix form (four rows by eight columns in this example), write latch circuits 2 (2-0 through 2-7) corresponding to each column, defective address latch circuits 3 (3-0 through 3-7) also corresponding to each column, a column decoder 4 for outputting bit line selection signals bitse10 through bitse17, and a word line decoder circuit 5. The write latch circuits 2 are connected at the input side with transfer gates Tr0 through Tr7 that receive the bit line selection signals bitse10 through bitse17 at their gates from the column decoder 4. Further, a transfer gate Tra that receives a signal rdpgen at its gate and a transfer gate Trb that receives a signal rdcamen at its gate are connected across the memory cell array 1 and each write latch circuit 2 and across the memory cell array 1 and each defective address latch circuit 3, respectively. The control gates of the memory cells of each row are connected to the corresponding word lines rw10, re11, rw12 and rw13. The drains of the memory cells of each column are connected to the corresponding bit lines b10 through b17, while the sources of all the memory cells are connected to a common source.

Figure 3:
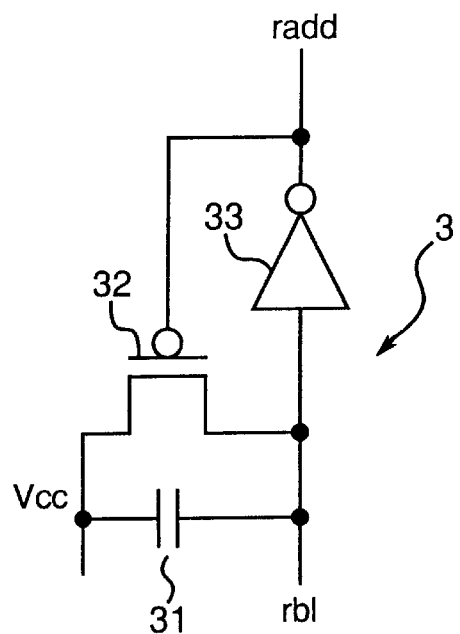
FIG. 3 is a circuit diagram showing an example of a defective address latch circuit to be used in the first and the second embodiments.
Figure 4:
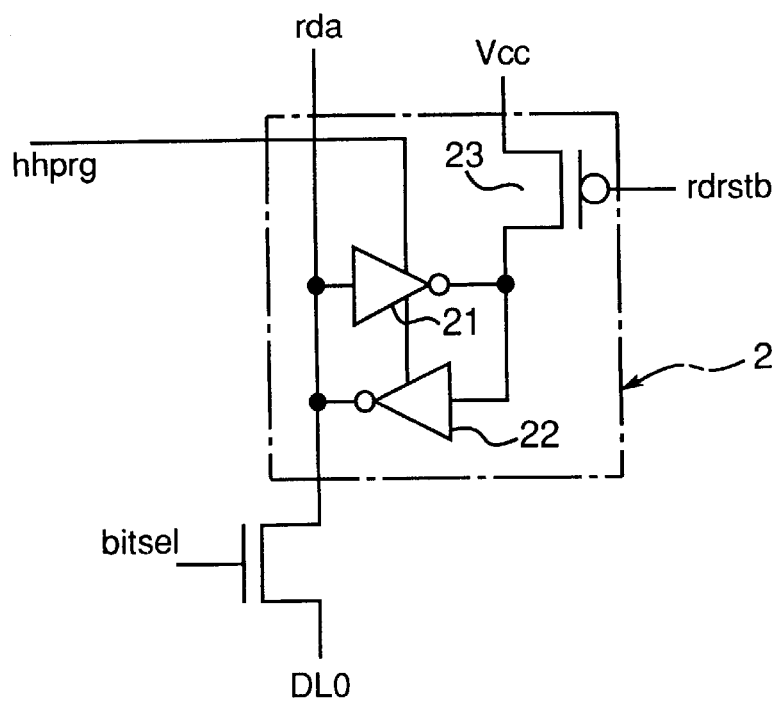
FIG. 4 is a circuit diagram showing an example of a write latch circuit to be used in the first and second embodiments.

Each write latch circuit 2 has the circuit construction shown in FIG. 4, and each defective address latch circuit 3 has the circuit construction shown in FIG. 3. The defective address latch circuit 3 includes a capacitor 31, a p-channel MOS transistor 32 and an inverter 33 and has a construction similar to those shown in FIGS. 9 through 11. On the other hand, the write latch circuit 2 includes two inverters 21 and 22 as well as a p-channel MOS transistor 23 that receives a signal rdrstb at its gate. This circuit construction is a combination of the p-channel MOS transistor 23 and the write latch circuit shown in FIG. 11.

The following describes a method of writing to the defective address data storage circuit.

First, all the memory cells are collectively brought into an erased state (i.e., a high threshold state). At this time, not only the memory cells for storing a defective address but also the regular memory cells (not shown) may be collectively erased.

The erasing is performed as follows. A voltage Vns (−8 V, for example) is applied to the common source and a substrate (well) on which and the memory cells are formed. By turning off the transfer gates Trb and Tra that receive the signal rdcamen and the signal rdpgen at their gates, the bit lines b10 through b17 connected to the drains of all the memory cells are brought into an open state. Also, a voltage Vpp (10 V, for example) is applied to the word lines rw10 through rw13 connected to the control gates of the memory cells. By this operation, the FN tunneling phenomenon occurs, whereby electrons are injected from the channel layer into the floating gate. As a consequence, the threshold voltage of all the memory cells m00 through m37 for storing the defective address increases to more than 4 V. The memory cells are thus placed in the erased state.

Next, as described hereinabove, writing of the defective address data is performed during the plurality of wafer tests. Reference is first made to the writing of defective address data on the basis of the first test result. Assume that data 0 and 1 are written to the memory cells m00 and m01, respectively.

First, the level of the signal rdrstb is changed from "high" to "low". This determines the initial state of the write latch circuit 2, so that an output rda from each write latch circuit 2 is set to "low". Subsequently, the signal rdrstb is set back to "high". First, a "low" corresponding to the defective address data 0 is output to a data line DL0 in accordance with a first timing. Synchronously with this, a "high" is output from the column decoder to bitse10, as a consequence of which the transfer gate Tr0 is turned on (at this time, the other transfer gates are off). By this operation, the "low" is input to the write latch circuit 2-0, whereas an output rda0 of this write latch circuit 2-0 maintains the "low" level. In this stage, the signal hhprg has a potential of Vcc (3 V, for example). On the other hand, the signal rdpgen is in a "low" state, and the transfer gate Tra whose gate receives this signal is off.

Next, a "high" corresponding to the defective address data 1 is output to the data line DL0 in accordance with a second timing. In accordance with this, a signal bitse11 of "high" level is output from the column decoder, as a consequence of which the transfer gate Tr1 is turned on (at this time, the other transfer gates are off). The signal of "high" level on the data line DL0 is supplied to the write latch circuit 2-1, so that an output rda1 of the write latch circuit 2-1 becomes "high" and latched.

Upon completion of the above data transfer, the signal hhprg is boosted to a voltage Vpg (5 V, for example) in order to increase the writing speed of the memory cell. Also, the signal rdpgen is made to have a voltage Vpps (7 V, for example), by which the transfer gates Tra that receive this signal rdpgen at their gates are turned on. Thus, the voltage Vss (0 V) of "low" level at rda0 is applied to the drain of the memory cell m00, while the voltage Vpg of "high" level at rda1 is applied to the drain of the memory cell m01. The sources of the memory cells are connected to the common source and put in the floating state (open).

If a voltage Vnn (−8 V, for example) is applied to the word line rw10 from the word line decoder circuit 5, then the FN tunneling phenomenon occurs in the memory cell m01, so that electrons are extracted from the floating gate (programming is performed). Consequently, the threshold value of the memory cell m01 is lowered to become 2 V or less. On the other hand, the FN tunneling phenomenon does not occur in the memory cell m00 since its drain has the voltage Vss. Accordingly, almost no electrons are extracted from the floating gate. Therefore, the initial erased state (in which the threshold value is more than 4 V) is maintained.

In the memory cells (m02 and others), other than the memory cells m00 and m01, whose control gates are connected to the identical word line rw10, the voltage Vss is supplied to their drains because the output rda of each write latch circuit 2 has been kept intact at "low" as set initially, and a threshold value of more than 4 V is maintained, as in the memory cell m00.

The writing of data 0 and 1 of the defective address on the basis of the first test result has been described above.

Next, a second writing of the defective address data on the basis of a second test result will be described. In this case, it is assumed that the defective address data 0 and 1 are written to memory cells m12 and m13 whose control gates are connected to the word line rw11 different from that of the aforementioned case.

First, the level of the signal rdrstb is changed from "high" to "low". This is to determine the initial state of the write latch circuit 2 (see FIG. 4), so that the output rda from each write latch circuit 2 is set to a "low" level. Subsequently, the signal rdrstb is set back to a "high" level.

Then, a "low" level signal corresponding to the defective address data 0 is output to the data line DL0 in accordance with the first timing. Synchronously with this, the "high" level is output from the column decoder 4 to bitse12, as a consequence of which the transfer gate Tr2 is turned on (at this time, the other transfer gates are off). By this operation, the "low" is supplied to a write latch circuit 2-2. An output rda2 of the write latch circuit 2-2 has been at a "low" level, and therefore, the "low" is maintained.

In this stage, the signal hhprg has the voltage Vcc (3 V, for example), while the signal rdpgen is at a "low" level. Therefore, the transfer gates Tra which are supplied with this signal at their respective gates are connected to this signal are off.

Next, a "high" corresponding to the defective address data 1 is output to the data line DL0 in accordance with the second timing. In accordance with this, a signal bitse13 of a "high" level is output from the column decoder 4, as a consequence of which the transfer gate Tr3 is turned on. In this stage, the other transfer gates are off. The "high" level signal on the data line DL0 is supplied to a write latch circuit 2-3, whereby an output rda3 of the write latch circuit 2-3 becomes "high", meaning that the data has been latched.

After the data transfer has been thus completed, then the signal hhprg is boosted to the voltage Vpg (5 V, for example) in order to increase the writing speed of the memory cell. Also, the signal rdpgen is set to the voltage Vpps (7 V, for example) to turn on the transfer gates Tra that receive this signal rdpgen at the gate. Accordingly, the voltage Vss (0 V) of a "low" level that is the output rda2 of the write latch circuit 2 is applied to the drain of the memory cell m12, while the voltage Vpg of a "high" level of the output rda3 is applied to the drain of the memory cell m13. The sources of these memory cells are connected to the common source and put in the floating state (open).

A voltage Vnn (−8 V, for example) is applied to the word line rw11 by the word line decoder circuit 5, by which the FN tunneling phenomenon occurs in the memory cell m13, extracting electrons from the floating gate (writing is performed). Consequently, the threshold value of the memory cell m13 is lowered to 2 V or less. On the other hand, the FN tunneling phenomenon does not occur in the memory cell m12 since its drain has the voltage Vss. Thus, almost no electrons are extracted from the floating gate, and the initial erased state (in which the threshold value is more than 4 V) is maintained.

In the memory cells (m10, m11, and others), other than the memory cells m12 and m13, whose control gates are connected to the identical word line rw11, the voltage Vss is supplied to their drains because the output rda of each write latch circuit 2 has been kept intact at "low" as set initially, and a threshold voltage of higher than 4 V is thus maintained, as in the memory cell m12.

The writing of data 0 and 1 of the defective address on the basis of the second test result has been described above.

When executing the writing of the defective address data on the basis of a third test result, the word line decoder circuit 5 selects the word line rw12 so as to store the defective address data in the memory cells m24 and m25. Likewise, the fourth writing is performed to memory cells m36 and m37 by selecting the word line rw13.

The signal rdcamen has a "low" level when writing the defective address data. Therefore, the transfer gates Trb (the transfer gates located between the memory cell array 1 and the defective address latch circuits 3), which receive the signal rdcamen at their respective gates, are in an off state.

As described above, in performing the write operation of the defective address data a plurality of times, memory cells connected to a different word line and different bit lines (connected to the drains of the memory cells) are used in a different write operation. In other words, writing to a memory cell connected to one word line is performed only once. By so doing, the shift in threshold value of the memory cells due to the gate disturb, which is a problem in the FN-FN type flash memory, can be avoided.

Figure 5:
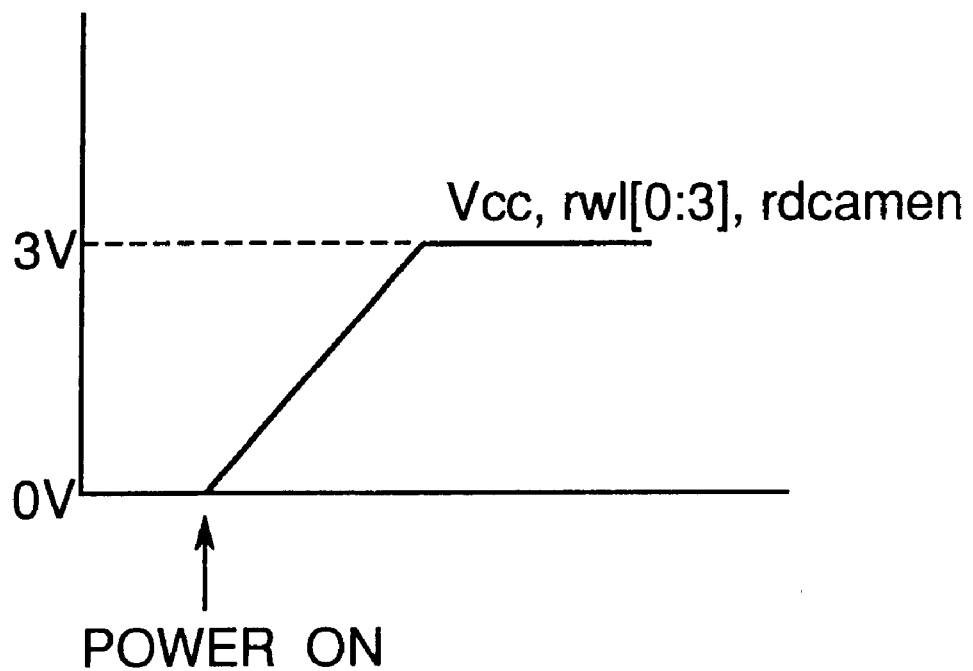
FIG. 5 is a graph showing the waveform of a node in a power-on stage in the first and second embodiments.

Reference is next made to the operation during the normal operation of the device in which the defective address data has been written in the defective address data storage circuit as described above. FIG. 5 shows how each signal rises when power is turned on to execute the normal operation of the device. As is apparent from this figure, in accordance with the increase of the power voltage Vcc, the signal rdcamen and all the word lines rw10 through rw13 connected with memory cells in which the defective address data are written increase together with the voltage Vcc. Thus, the transfer gates Trb, which receive the signal rdcamen at their respective gates, are turned on. Further, the signal rdpgen has a "low" level in this stage, and the transfer gates Tra (i.e., transfer gates located between the write latch circuits 2 and the memory cell array 1), which receive the signal rdpgen at their respective gates, are off. The voltage applied to the word lines rw10 through rw13 upon turning on the power may be identical to a voltage applied to a selected word line to read from a primary memory cell array of the device.

The present invention is characterized in that data are written to the memory cells connected to different word lines, and that all the word lines connected to these memory cells are turned on during the normal operation of the device. A case is now considered where at least one of the memory cells connected to one bit line b1 stores data "1" (that is, the threshold value of the at least one memory cell is not higher than 2 V). For example, assume that the memory cell m01 has a voltage of not higher than 2 V and that the other three memory cells m11, m21 and m31 connected to the identical bit line b11 are in the erased state, maintaining the high threshold value. In this case, when the power voltage Vcc rises, the voltage of an input rb11 is once increased by the coupling with the capacitor 31 connected to the voltage Vcc in the defective address latch circuit 3 (3-1) shown in FIG. 3. However, because the threshold value of the memory cell m01 is low, a current flows and the voltage of the input rb11 is discharged through the memory cell m01, making the input rb11 have the potential Vss of the common source. As a result, the output radd0 comes to have a "high" level, or the data "1".

If the written data is 0, or if, for example, the memory cell m00 has a voltage of higher than 4 V and the other three memory cells m10, m20 and m30 connected to the identical bit line b10 are in the erased state with the high threshold value, then no current flows through the memory cells since the threshold values of all the memory cells are larger than 4 V. Therefore, in the corresponding defective address latch circuit 3 (3-0), the voltage of the input rb10 is increased by the coupling with the capacitor 31 connected to the power supply Vcc. Thus, the output of the inverter 33 comes to have a "low" level and the p-channel MOS transistor 32 is turned on to latch rb10 with the voltage Vcc. Therefore, the output radd0 comes to have a "low" level, or the data "0".

In the aforementioned example, the memory cells m01 and m13 are in the programmed state (the threshold value is not higher than 2 V), and therefore, the outputs radd1 and radd3 of the defective address latch circuits 3-1 and 3-3 connected to the drains of these memory cells become "high". On the other hand, the memory cells m00 and m12 remain in the erased state (the threshold value is larger than 4 V), and the memory cells m10, m20 and m30 and the memory cells m02, m22 and m32, which have their drains connected to the bit lines b10 and b12 to which the drains of the memory cells m00 and m12 are connected, are also in the erased state. Therefore, the outputs radd0 and radd2 of the defective address latch circuits 3-0 and 3-2 connected to the drains of these memory cells become "low". Consequently, the data stored as the defective address 0101 in the memory cell array 1 are output as 0, 1, 0, 1 from the outputs radd0, radd1, radd2 and radd3. The remaining defective address latch circuits 3 output the stored defective address data in a similar manner.

Figure 6:
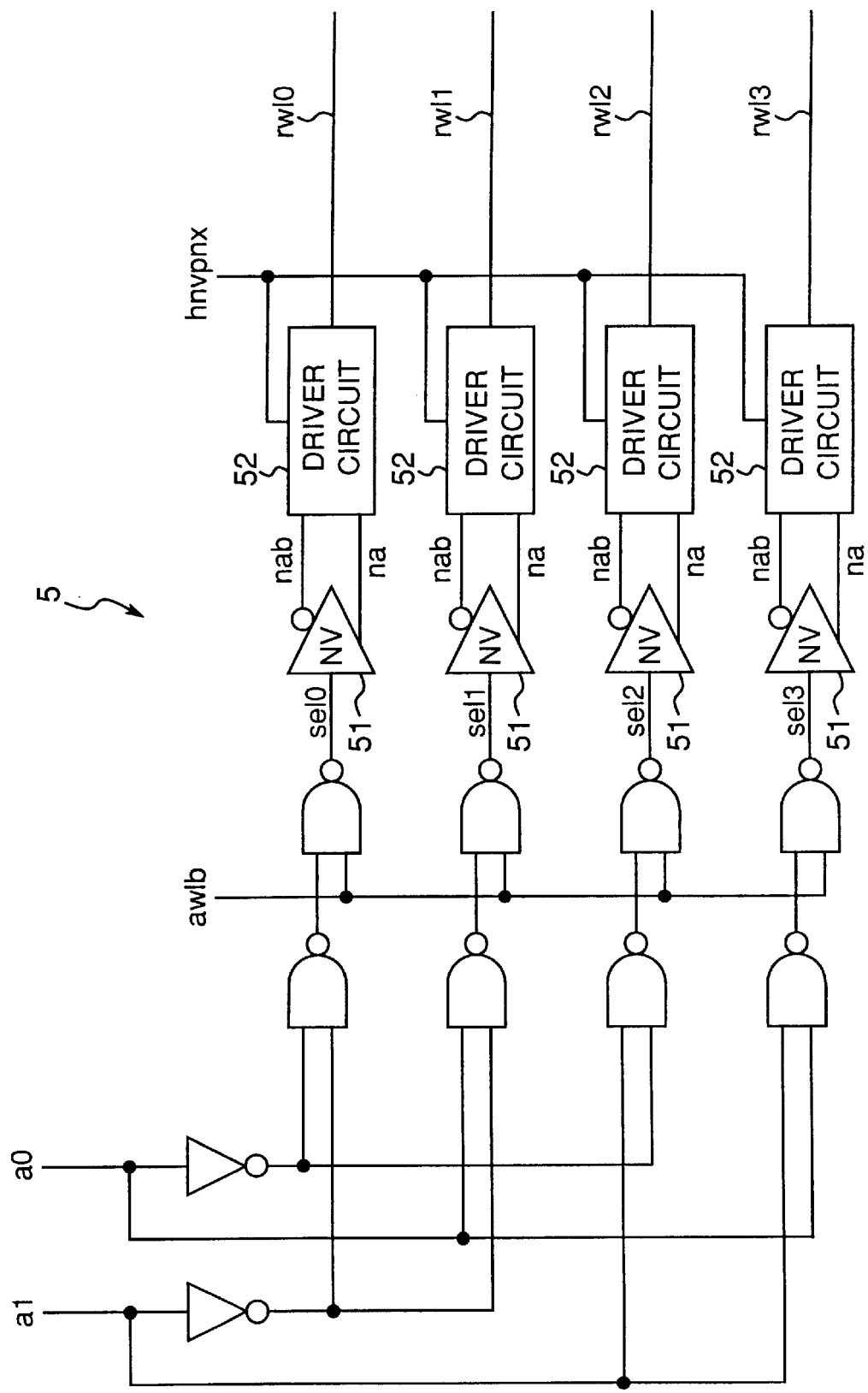
FIG. 6 is a circuit diagram showing an example of a word line decoder circuit to be used for the first and second embodiments.
Figure 7:
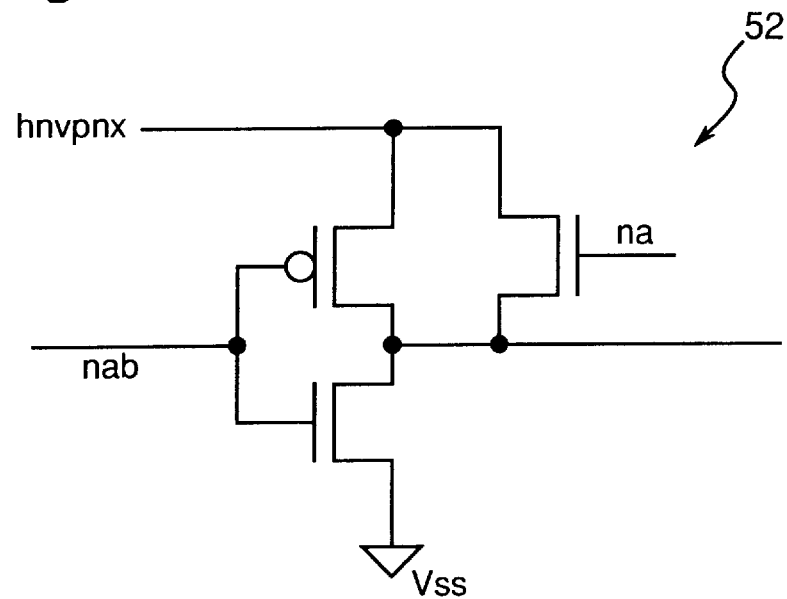
FIG. 7 is a circuit diagram of a driver circuit to be used for the word line decoder circuit of FIG. 6.
Figure 8:
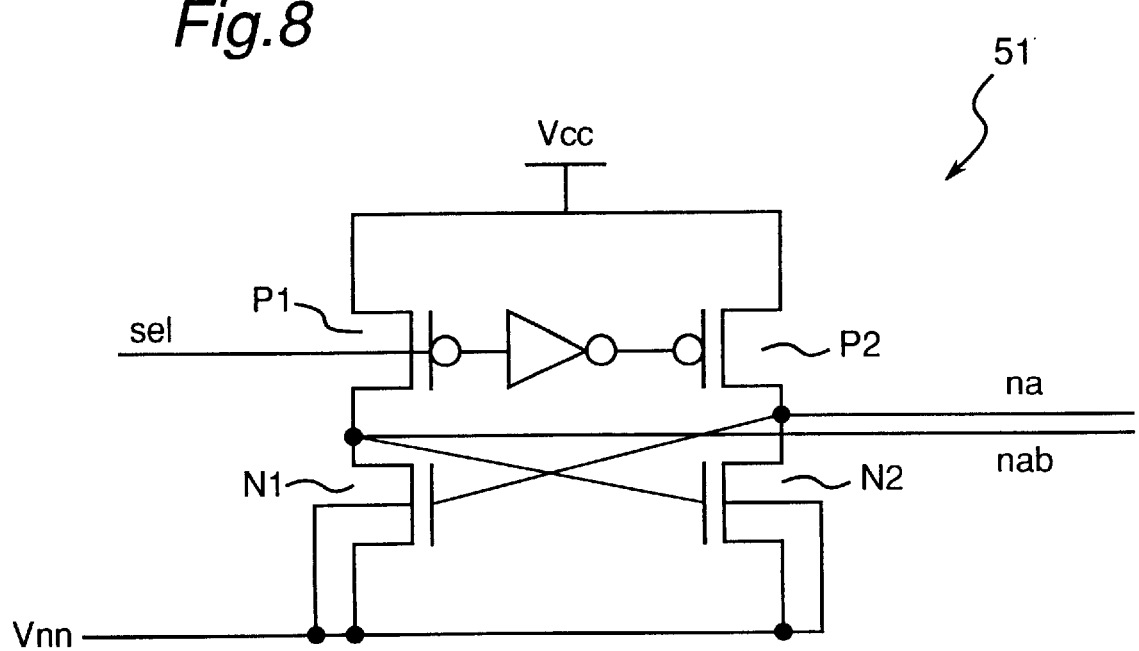
FIG. 8 is a circuit diagram of a negative voltage level shifter to be used for the word line decoder circuit of FIG. 6.

Next, FIG. 6 shows an example of the word line decoder circuit 5 for realizing the aforementioned operation. FIG. 7 shows the construction of a driver circuit 52 to be used in the word line decoder circuit 5 of FIG. 6, and FIG. 8 shows the construction of a negative voltage level shifter 51 to be used also in the word line decoder circuit 5 of FIG. 6.

First, in the first erase operation, by inputting a "low" level signal, i.e., the voltage Vss through an aw1b terminal and inputting a voltage Vpp through an hnvpnx terminal, all the word lines rw10 through rw13 are selected, and the voltage Vpp is output to these word lines. In the subsequent programming operation to write defective address data to the memory cells, the aw1b terminal is made "high", namely, the voltage Vcc is applied to the aw1b terminal, and a voltage Vnn is applied to the hnvpnx terminal, and a desired word line is selected by means of terminals a0 and a1. For example, by making both the terminals a0 and a1 have a "low" level, the word line rw10 is selected. The voltage Vnn is output to the selected word line, and the voltage Vss is output to the unselected word line. Then, an input se10 to the negative voltage level shifter 51 comes to have a "high" level, or is supplied with the voltage Vcc, so that a p-channel MOS transistor P2 and an n-channel MOS transistor N1 in the negative voltage level shifter 51 are turned on. Consequently, the voltage Vcc and the voltage Vnn are supplied to one output terminal na and the other output terminal nab, respectively, of the negative voltage level shifter 51. These signals are supplied to the driver circuit 52 of the next stage, and eventually the voltage of hnvpnx is output to the word line rw10.

On the other hand, for unselected word lines, for example, the word line rw11, an input se11 to the negative voltage level shifter 51 becomes "low", or has the voltage Vss. Therefore, a p-channel MOS transistor P1 and an n-channel MOS transistor N2 are turned on in the negative voltage level shifter 51, and the voltage Vnn is output to the output terminal na, and the voltage Vcc to the output terminal nab. These signals are input to the driver circuit 52 of the next stage, and eventually the voltage Vss is output to the unselected word line rw11. The voltage Vss is similarly output to the other unselected word lines rw12 and rw13.

In the normal device operation stage, by making the terminal aw1b have a "low" level, or the voltage Vss, all the word lines are selected and the voltage Vcc applied to the terminal hnvpnx in this stage is output to all the word lines via the driver circuit 52.

The output voltages and input voltages from and to the word line decoder circuit 5 in each of the aforementioned modes are summarized in Table 1 below.

TABLE 1

| | | Program | Erase | Program verify | Erase verify | Normal mode |
|---|---|---|---|---|---|---|
| Word line | Selected | Vnn (−8V) | Vpp (10V) | VvP (2V) | Vve (4V) | Voc (3V) |
| | Unselected | Vss (0V) | — | Vss (0V) | Vss (0V) | — |

TABLE 1-continued

| | Program | Erase | Program verify | Erase verify | Normal mode |
|---|---|---|---|---|---|
| aw1b | Vcc | Vss | Vcc | Vcc | Vss |
| a [0:1] | Select | Don't care | Select | Select | Don't care |
| hnvpnx | Vnn | Vpp | Vvp | Vve | Vcc |

Table 1 also shows output voltages and input voltages from and to the word line decoder circuit 5 in an erase verify operation and a program verify operation. The erase verify operation is an operation to verify whether or not the memory cells have come to have the desired threshold value of higher than 4 V in the erase operation, by applying a voltage of 4 V to the word line. The program verify operation is an operation to verify whether or not the memory cell subjected to programming has come to have a desired threshold voltage of 2 V or less, by applying a voltage of 2 V to the word line.

Finally, it is checked whether or not the output from the defective address data latch circuit coincides with addresses for accessing the memory region proper of the flash memory device (by, for example, taking the exclusive OR logic value of the output from the defective address data latch circuit and a value on a specified address line). If the memory region is accessed at an address that coincides with a stored defective address, then the address of the defective portion (i.e., the defective address) in the memory region is changed into a reserved address for relief use by, for example, changing a most significant bit of the defective address, to thereby substitute a non-defective portion for the defective portion by the bit line, word line, or the like. The defective address in the memory region proper of the device is thus relieved.

Second Embodiment

Figure 2:
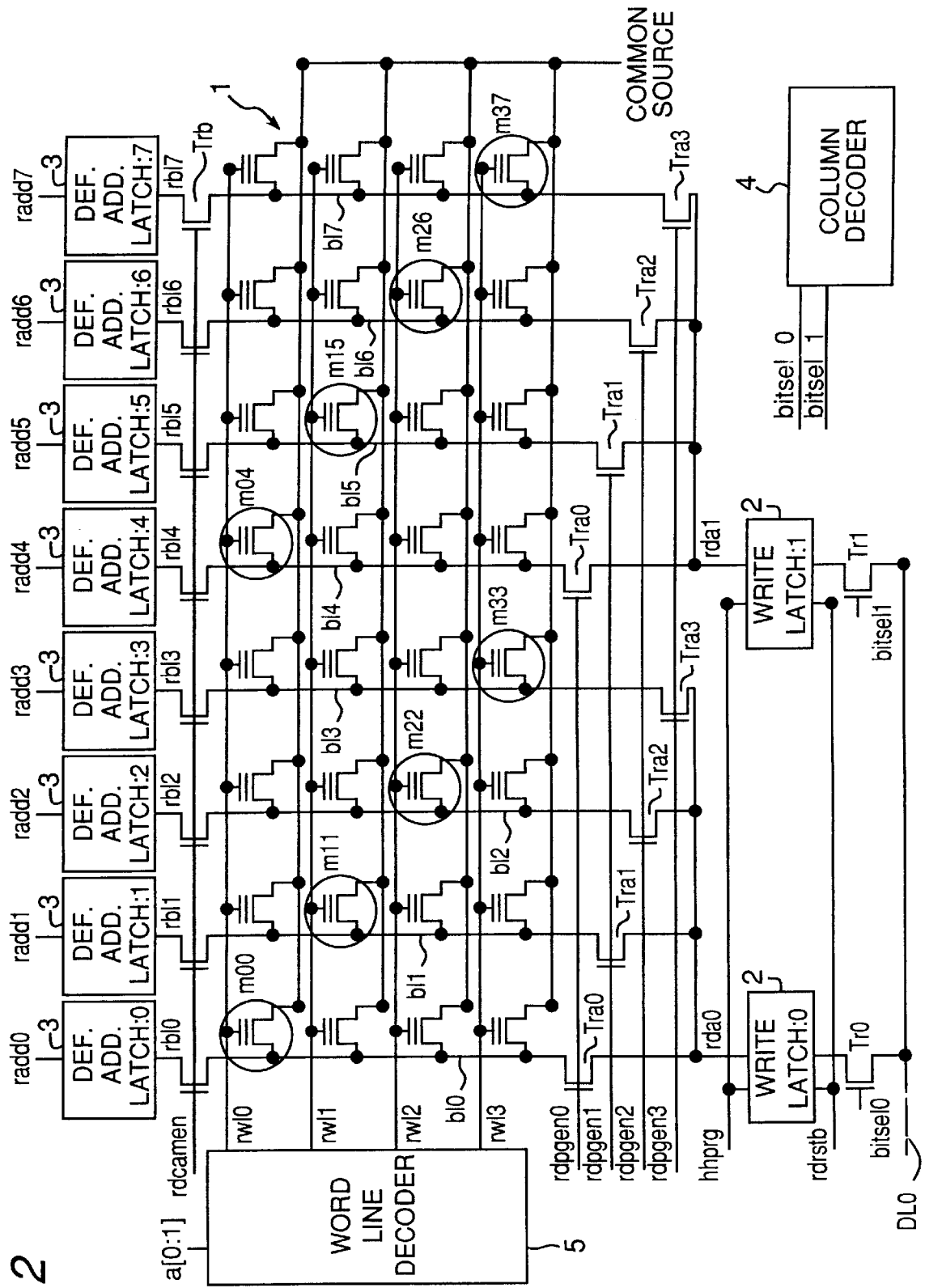
FIG. 2 is a circuit diagram showing a second embodiment of the present invention.

FIG. 2 shows a circuit diagram of a defective address data storage circuit according to the second embodiment of the present invention. As is apparent from FIG. 2, one write latch circuit is provided per four defective address latch circuits in the second embodiment, in contrast to the first embodiment in which the write latch circuits 2 are provided in one to one correspondence with the defective address latch circuits 3. The defective address latch circuits and the write latch circuits for use in this embodiment have the same constructions as those of the circuits employed in the first embodiment, the constructions being shown in FIG. 3 and FIG. 4. In FIG. 2, the components identical or similar to those of FIG. 1 are denoted by the same reference numerals as the reference numerals used in FIG. 1.

The reason why the number of the write latch circuits 2 is smaller than the number of the defective address latch circuits 3 in the present embodiment is that the program operation is not simultaneously performed for all the memory cells. In the example shown in FIG. 2, each defective address is provided by a combination of the defective address latch circuits 3-0 and 3-4, a combination of the circuits 3-1 and 3-5, a combination of the circuits 3-2 and 3-6, and a combination of the circuits 3-3 and 3-7.

The write operation of the defective address data to this defective address data storage circuit is now described.

First, erasing is performed before the writing of the defective address data. This erasing is performed in the same manner as that described in connection with the aforementioned first embodiment. Therefore, no further description on the erasing is provided here.

Next, while a plurality of wafer tests are carried out, writing of defective address data is performed on the basis of the first test result. Assume that data 0 and 1 are written to the memory cells m00 and m04, respectively.

First, the level of the signal rdrstb is changed from "high" to "low". This determines the initial state of the write latch circuit 2, so that an output rda from each write latch circuit 2 is set to "low". Subsequently, the signal rdrstb is set back to "high". First, a "low" signal corresponding to the defective address data 0 is output to a data line DL0 in accordance with the first timing. Synchronously with this, the bitse10 signal of a "high" level is output from the column decoder, as a consequence of which the transfer gate Tr0 is turned on (at this time, the other transfer gates are off). Thus, the "low" signal indicating the defective address data 0 is input to the write latch circuit 2-0, whereas an output rda0 of this write latch circuit 2-0 maintains the "low" level. In this stage, a voltage of Vcc (3 V, for example) is applied to hhprg. On the other hand, a "low" voltage is applied to rdpgen0–rdpgen3, and the transfer gates Tra1–Tra3 which receive the signals rdpgen0–rdpgen3 at their respective gates are in an off state.

Next, a "high" corresponding to the defective address data 1 is output to the data line DL0 in accordance with a second timing. In accordance with this, a signal bitse11 of a "high" level is output from the column decoder 4, as a consequence of which the transfer gate Tr1 is turned on (at this time, the other transfer gates are off). The "high" signal on the data line DL0 is supplied to the write latch circuit 2-1, so that an output rda1 of the write latch circuit 2-1 becomes "high" and latched.

Upon completion of the above data transfer, the signal hhprg is boosted to a voltage Vpg (5 V, for example) in order to increase the writing speed of the memory cell. Also, the signal rdpgen0 is made to have a voltage Vpp (7 V, for example), by which the transfer gates Tra0 that receive this signal rdpgen0 at their gates are turned on. Thus, the "low" voltage Vss (0 V) of the output rda0 of the write latch circuit 2-0 is applied to the drain of the memory cell m00, while the "high" voltage Vpg of the output rda1 of the write latch circuit 2-1 is applied to the drain of the memory cell m01. The sources of these memory cells are connected to the common source and placed in the floating state (open).

If a voltage Vnn (−8 V, for example) is applied to the word line rw10 from the word line decoder circuit 5, then the FN tunneling phenomenon occurs in the memory cell m04, so that electrons are extracted from the floating gate (programming is performed). Consequently, the threshold value of the memory cell m04 is lowered to become 2 V or less. On the other hand, the FN tunneling phenomenon does not occur in the memory cell m00 because of the voltage Vss across its drain. Accordingly, almost no electrons are extracted from the floating gate of the memory cell m04. Therefore, the initial erased state (in which the threshold value is more than 4 V) is maintained.

In the memory cells, other than the memory cells m00 and m01, whose control gates are connected to the identical word line rw10, their drains are open because the transfer gates Tra1–Tra3 whose respective gates are connected with rdpgen1–rdpgen2 are in an off state, and a threshold value of more than 4 V is maintained in those memory cells like the memory cell m00.

The writing of data 0 and 1 of the defective address on the basis of the first test result has been described above. Next, the second writing of the defective address data on the basis of the second test result will be described. In this case, it is assumed that the defective address data 0 and 1 are written to memory cells m11 and m15 whose control gates are connected to the word line rw11 different from that of the aforementioned case.

First, similar to the first writing, the level of the signal rdrstb is changed from "high" to "low" to set the initial state of the write latch circuit 2, so that the output rda from each write latch circuit 2 is set to a "low" level. Subsequently, the signal rdrstb is set back to a "high" level.

Then, a "low" level signal corresponding to the defective address data 0 is output to the data line DL0 in accordance with the first timing. Synchronously with this, a "high" level signal is output from the column decoder 4 to bitse10, as a consequence of which the transfer gate Tr0 is turned on (at this time, the other transfer gate is off). Thus, the "low" is supplied to the write latch circuit 2-0. The output rda0 of the write latch circuit 2-0 maintains "low". In this stage, the voltage Vcc (3 V, for example) is applied to hhprg, and the signals rdpgen0–rdpgen3 are in the "low" state so that the transfer gates Tra0–Tra3 which receive the signals rdpgen0–rdpgen3 at their respective gates are in an off state.

Next, a "high" corresponding to the defective address data 1 is output to the data line DL0 in accordance with the second timing. In accordance with this, a signal bitse11 of a "high" level is output from the column decoder 4, as a consequence of which the transfer gate Tr1 is turned on. In this stage, the other transfer gate is off. The "high" level signal on the data line DL0 is supplied to the write latch circuit 2-1, whereby the output rda1 of the write latch circuit 2-1 becomes "high", meaning that the data has been latched.

After the data transfer has been thus completed, then the signal hhprg is boosted to the voltage Vpg (5 V, for example) in order to increase the writing speed to the memory cell. Also, the signal rdpgen1 is set to the voltage Vpps (7 V, for example) to turn on the transfer gates Tra1 that receive this signal rdpgen1 at the gate. Accordingly, the "low" voltage Vss (0 V) of the output rda0 of the write latch circuit 2-0 is applied to the drain of the memory cell m11, while the "high" voltage Vpg of the output rda1 of the write latch circuit 2-1 is applied to the drain of the memory cell m15. The sources of these memory cells are connected to the common source and put in the floating state (open).

Then, a voltage Vnn (−8 V, for example) is applied to the word line rw11 by the word line decoder circuit 5, by which the FN tunneling phenomenon occurs in the memory cell m15, extracting electrons from the floating gate (writing is performed). Consequently, the threshold value of the memory cell m15 is lowered to 2 V or less. On the other hand, the FN tunneling phenomenon does not occur in the memory cell m11 since its drain has the voltage Vss. Thus, almost no electrons are extracted from the floating gate, and the initial erased state (in which the threshold value is more than 4 V) is maintained. In the memory cells, other than the memory cells m11 and m15, whose control gates are connected to the identical word line rw11, their drains are open because the transfer gates Tra0, Tra2, Tra3 which receive the signals rdpgen0, rdpgen2, rdpgen3 at their respective gates are in an off state. Accordingly, the threshold voltage of these memory cells remains more than 4 V, like the memory cell m11.

The writing of data 0 and 1 of the defective address on the basis of the second test result has been described above. When executing the writing of the defective address data on the basis of a third test result, the word line decoder circuit 5 selects the word line rw12 so as to store the defective address data in the memory cells m22 and m26. Likewise, the fourth writing is performed to memory cells m33 and m37 by selecting the word line rw13. It is to be noted that when writing the defective address data, the signal rdcamen is made "low" to turn off the transfer gates Trb (the transfer gates located between the memory cell array 1 and the defective address latch circuits 3) which receive the signal rdcamen at their respective gates.

As described above, in performing the write (program) operation of the defective address data a plurality of times, memory cells connected to a different word line and different bit lines (connected to the drains of the memory cells) are used in a different write operation. In other words, writing to memory cells connected to one word line is performed only once. By so doing, the threshold shift or change of the memory cells due to the gate disturb, which is a big problem in the FN-FN type flash memory, can be avoided.

The normal operation of the device of the second embodiment in which the defective address data have been written is the same as that of the aforementioned first embodiment except that the defective address 0101 is expressed by the sequence of outputs radd0, radd4, radd1 and radd5 in the second embodiment. Therefore no description on the normal operation of the device is provided here. Furthermore, because the word line decoder circuit 5 in this embodiment operates like the word line decoder circuit 5 in the first embodiment, no description on it is provided here, either.

It is to be noted that the present invention is not limited to the aforementioned two embodiments, and various modifications can be made without departing from the spirit and scope of the invention. For example, the concrete voltage values to be used for the writing, erasing and so on are not limited to the aforementioned ones and may be changed suitably. The configuration (for example, the number of word lines, the number of bit lines and so on) of the memory cell array 1 inside the defective address data storage circuit should properly be set taking into consideration the memory cell characteristics, the frequency of device tests, and so on.

The present invention is good for FN-FN type nonvolatile semiconductor memories which are capable of reducing the consumption of power and in which the high threshold state of the memory cell is used as the erased state and the low threshold state of the memory cell is used as the written state. The present invention is particularly useful for:

1) ACT (Asymmetrical Contactless Transistor) flash memory (refer to IEDM Technical Digest, pp 267–270, 1995, "A New Cell Structure for Sub-quarter Micron High Density Flash Memory", and Technical Report of IEICE, ICD97-21, p. 37, 1997, "A sensing scheme for a ACT flash memory");

2) AND type flash memory (refer to Technical Report of IEICE, ICD93-128, p. 37, 1993, "'AND' cell structure for a 3V-only 64 Mbit Flash Memory"); and 3) DINOR type flash memory (refer to Technical Report of IEICE, ICD95-38, p. 55, 1995, "A 3.3V only 16 Mb DINOR Flash Memory").

The invention being thus described, it will be obvious that the same may be varied in many ways. Such variations are not to be regarded as a departure from the variations are not to be regarded as a departure from the spirit and scope of the invention, and all such modifications as would be obvious to one skilled in the art are intended to be included within the scope of the following claims.

What is claimed is:

1. A defective address storage circuit for storing address data of a defective portion occurring in a memory cell array of a nonvolatile semiconductor memory device having a redundant function, comprising:

electrically erasable programmable memory cells arranged in rows and columns;

word lines connected with the memory cells in each row;

bit lines connected with the memory cells in each column;

a bit line selection device; and a word line selection device selecting a different word line in a different write operation of defective address data.

2. The defective address storage circuit according to claim 1, wherein the bit line selection device selects a different bit line in a different write operation of defective address data such that only one memory cell per bit line is written.

3. The defective address storage circuit according to claim 1, wherein both erase and write operations for the memory cells are performed using Fowler-Nordheim tunneling phenomenon.

4. The defective address storage circuit according to claim 3, wherein before writing the defective address data, the word line selection device selects all of the word lines such that every memory cell is placed in a high threshold state in which a threshold voltage of the memory cell is higher than a read voltage to be applied to a word line in reading written data from a memory cell, and wherein memory cells not written keep the high threshold state after writing of the defective address data has been completed.

5. The defective address storage circuit according to claim 1, wherein when reading written data, the word line selection device selects all of word lines connected with memory cells to which the defective address data have been written, and applies a read voltage to these word lines.

6. The defective address storage circuit according to claim 4, wherein the read voltage is a supply voltage.

7. The defective address storage circuit according to claim 5, wherein the read voltage is a supply voltage.

8. A method of writing address data of a defective portion occurring in a memory cell array of a nonvolatile semiconductor memory having a redundant function to a defective address data storage circuit which is included in the nonvolatile semiconductor memory and has electrically erasable programmable memory cells arranged in rows and columns, word lines connected with the memory cells in each row, and bit lines connected with the memory cells in each column, comprising:

a first step of selecting all the word lines to collectively erase all the memory cells in the defective address data storage circuit; and a second step of selecting one of the word lines and also selecting bit lines corresponding in number to bits of the address data to be written, to thereby write the address data to memory cells connected to the selected word line and bit lines, wherein when performing the second step repeatedly, selection of one word line is made from word lines not previously selected to thereby write a memory cell connected to a different word line in each of write operations of defective address data.

9. The method according to claim 8, when performing the second step repeatedly, a different bit line is selected in each of write operations such that only one memory cell per bit line is written.

10. The method according to claim 8, wherein both erase and write operations for the memory cells in the first and second steps, respectively, are performed using Fowler-Nordheim tunneling phenomenon.

11. The method according to claim 10, wherein in the first step, every memory cell is placed in a high threshold state in which the memory cell has a threshold voltage higher than a read voltage, and wherein memory cells not written in the second step are made to keep the high threshold.

12. The defective address storage circuit according to claim 11, wherein the read voltage is a supply voltage.

* * * * *